United States Patent [19]
Leman

[11] Patent Number: 6,046,912
[45] Date of Patent: Apr. 4, 2000

[54] COMPUTER SYSTEM HAVING RISER BOARD EXPANSION CAPABILITY

[75] Inventor: Michael V. Leman, Eagle, Id.

[73] Assignee: Micron Electronics, Inc., Nampa, Id.

[21] Appl. No.: 09/325,622

[22] Filed: Jun. 3, 1999

[51] Int. Cl.[7] ................................................. H05K 1/14
[52] U.S. Cl. ............................ 361/784; 361/785; 361/683; 361/756; 361/803; 361/686; 439/74; 439/61; 439/629; 439/638; 439/541.5
[58] Field of Search ................................... 361/784, 683, 361/785, 756, 803, 686; 439/74, 61, 629, 638, 62, 541.5; 312/223.1, 223.2

[56] References Cited

U.S. PATENT DOCUMENTS

| | | | |
|---|---|---|---|
| 5,544,006 | 8/1996 | Radloff | 361/683 |
| 5,611,057 | 3/1997 | Pecone et al. | 395/282 |
| 5,640,309 | 6/1997 | Carney et al. | 361/801 |
| 5,715,146 | 2/1998 | Hoppal | 361/796 |
| 5,831,821 | 11/1998 | Scholder et al. | 361/686 |
| 5,943,215 | 8/1999 | Carney et al. | 361/756 |
| 5,951,665 | 9/1999 | Crane, Jr. et al. | 710/126 |
| 5,963,431 | 10/1999 | Stancil | 361/803 |
| 5,963,681 | 10/1999 | Clements | 385/14 |

OTHER PUBLICATIONS

Motherboard Express dated Oct. 21, 1999 pp. 1–6.

Primary Examiner—Leo P. Picard
Assistant Examiner—David Foster
Attorney, Agent, or Firm—Trop, Pruner & Hu, P.C.

[57] ABSTRACT

A computer system is described having a chassis, a motherboard coupled to the chassis, the motherboard having at least one PCI (Peripheral Component Interconnect) connector, and a riser board coupled to the at least one PCI connector. When installed, a surface of the riser board having at least one PCI connector is oriented substantially perpendicular to the motherboard. The computer system may also include a bracket connected to the motherboard, that allows the motherboard to be slideably inserted and removed from the chassis.

18 Claims, 7 Drawing Sheets

COMPUTER SYSTEM HAVING RISER BOARD EXPANSION CAPABILITY

BACKGROUND

The invention relates generally to computer systems and, more particularly but not by way of limitation, to an improved motherboard apparatus for personal computer systems.

Personal computers are stand-alone computer systems housed in a chassis that may be conveniently placed on a user's desk or the floor next to the user's desk. Input/output (I/O) devices such as a video monitor, keyboard, mouse, and printer are typically coupled to the system by means of cables that plug into connectors at a back panel of the chassis. Inside the chassis is a system board, called a motherboard, that holds the electronic components of the computer. The computer system may have its capabilities enhanced through the use of expansion add-in cards. Add-in cards are generally inserted into slots that are mounted directly on the motherboard. The motherboard has printed circuit wiring that distributes signals from the add-in cards to appropriate components on the motherboard. There are currently two primary motherboard standards for personal computers: ATX and NLX. See the ATX (version 2.01, 1997) and NLX (version 1.2, 1997) specifications which are available from Intel Corporation.

Referring to FIG. 1, an ATX-based computer system 100 includes ATX motherboard 102 attached to chassis 104 at a number locations (indicated by filled circles 106 in FIG. 1). Motherboard 102 provides ISA (Industry Standard Architecture) slots 108, PCI (Peripheral Component Interconnect) slots 110, system memory slots 112, I/O connectors 114, processor receptacle 116, and floppy disk and IDE (Integrated Drive Electronics) connectors 118. As shown, ATX motherboard 102 is orientated in chassis 104 so that power supply unit 120 is proximally located to processor receptacle 116 and peripheral bays 122 and 124.

FIG. 2 shows a top view of a NLX-based computer system 200 that includes NLX motherboard 202, riser card connector 204, riser card 206, chassis 208, power supply 210, and expansion bay 212. Riser card connector 204 is a 340 pin riser connector. Motherboard 202 is coupled to chassis 208 by a rail mechanism (not shown) which allows it to be easily inserted and removed from chassis 208 as shown by arrow 214. Motherboard 202 provides I/O connectors 216 and processor receptacle 218, while riser card (and connector) provide add-in card slots and connectivity to other devices such as floppy disks and IDE devices. Use of riser card 206 allows all add-in card slots to be mounted parallel to motherboard 202.

While ATX-based computer system 100 provides a large expansion capability (through multiple add-in card slots), it is relatively difficult to manufacture and service because of the manner in which motherboard 102 is connected to chassis 104. While NLX-based computer system 200 provides a mechanism to easily assemble and service motherboard 202, it does not generally provide the expansion capability of an ATX-based computer system. It is therefore desirable to have an improved motherboard that may provide the expansion capability of an ATX-based computer system and the ease of manufacture and serviceability of a NLX-based computer system.

SUMMARY

The invention provides a computer system having a chassis, a motherboard coupled to the chassis (the motherboard having at least one PCI (Peripheral Component Interconnect) connector connected to a top surface), and a riser board coupled to the at least one PCI connector of the motherboard, wherein the riser board has at least one PCI connector on a first surface, the first surface oriented substantially perpendicular to the motherboard. In one embodiment, a connector allows the motherboard to slide into a vertically oriented riser board. In another embodiment, a riser board is adapted to insert into a PCI connector on the motherboard. In yet another embodiment, the motherboard may be connected to a bracket thereby allowing the motherboard be slideably inserted and removed from the chassis.

DETAILED DESCRIPTION

Techniques to employ an ATX motherboard in a configuration that provides ease of assembly and serviceability are described. The following embodiments of the invention, described in terms of a standard ATX motherboard, are illustrative only and are not to be considered limiting in any respect. For example, those of ordinary skill in the art will recognize that the invention may be equally beneficial when applied to different types of ATX motherboards such as Baby ATX, Mini-ATX, and LPX motherboards, as well as other styles of motherboards.

Figure 1:
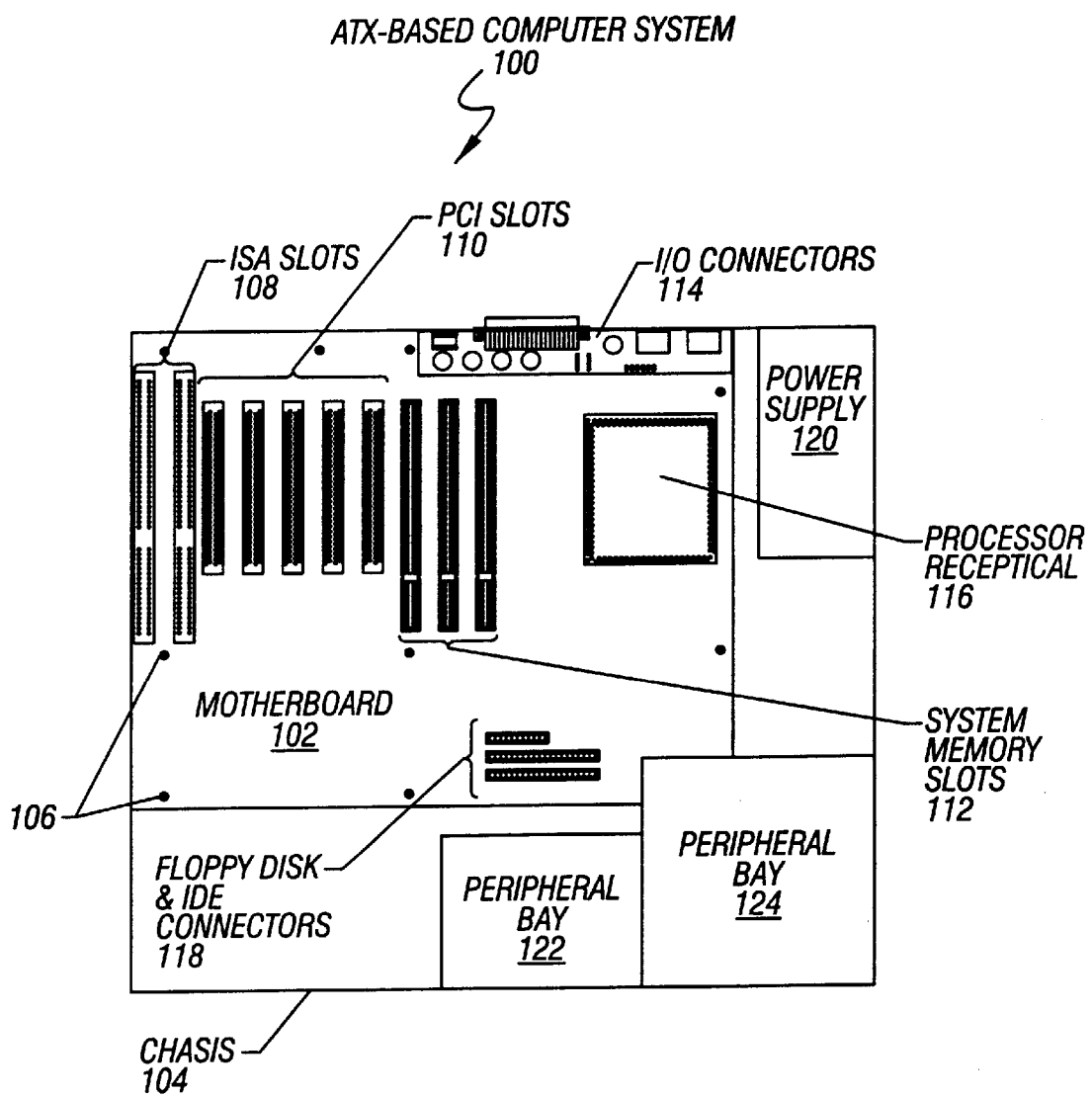
FIG. 1. shows a prior art ATX-based computer system.
Figure 2:
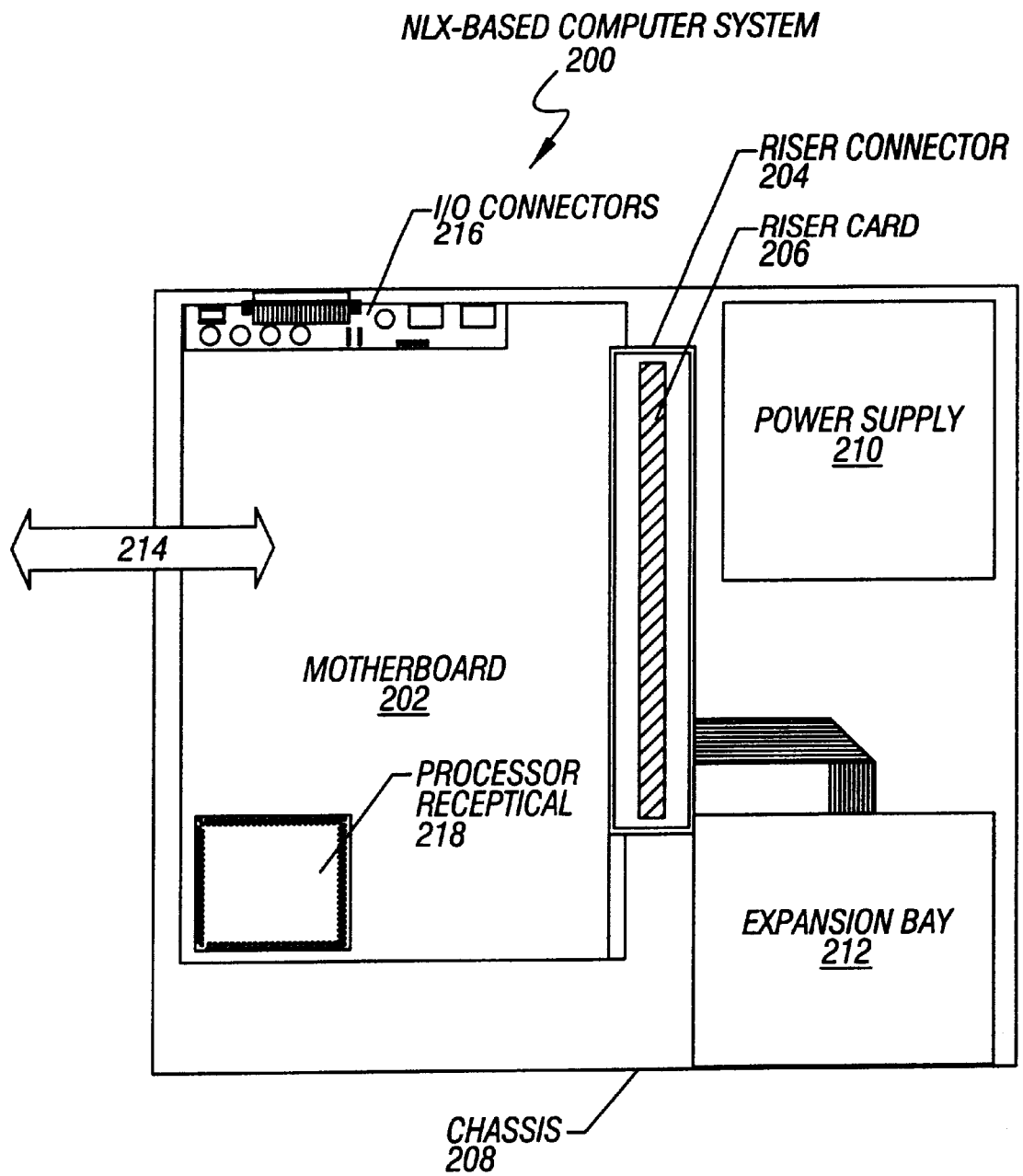
FIG. 2. shows a prior art NLX-based computer system.
Figure 3:
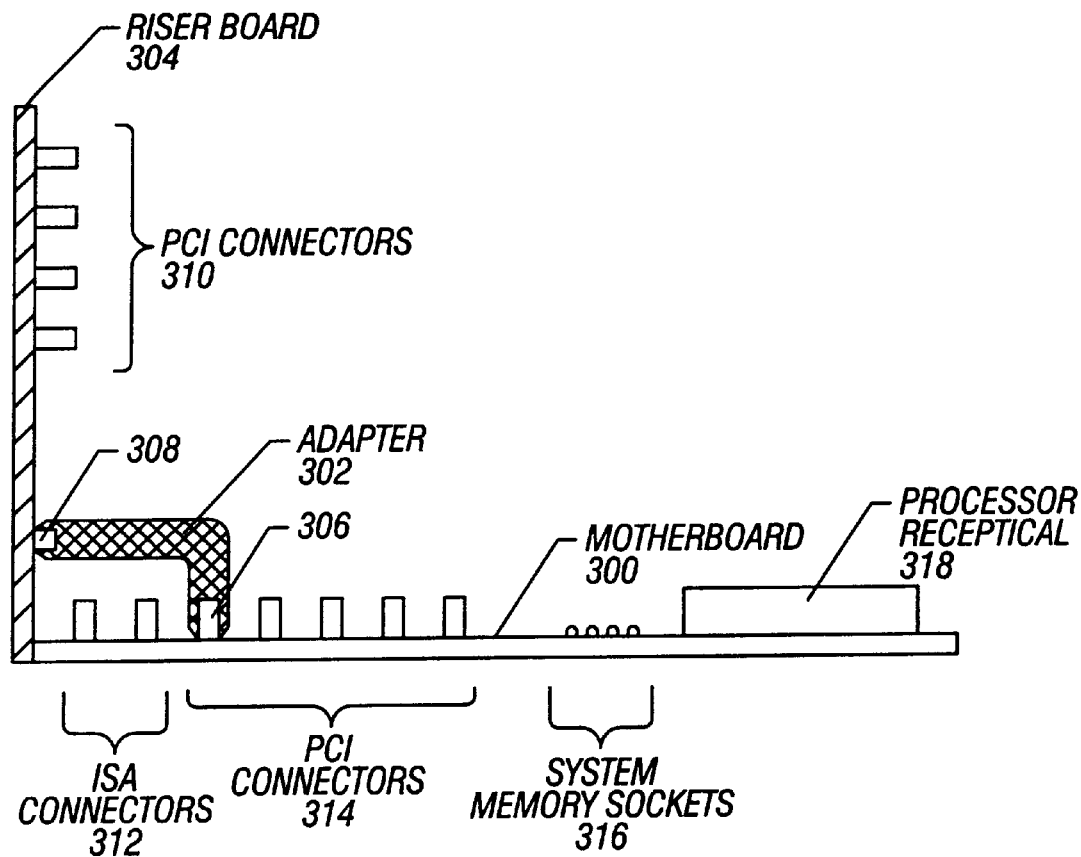
FIGS. 3. shows a side view of a ATX motherboard, adapter, and riser board in accordance with one embodiment of the invention.

Referring to FIG. 3, in one embodiment of the invention ATX motherboard 300 may be fitted with adapter 302 designed to couple motherboard 300 to riser board 304. Functionally, adapter 302 couples the motherboard PCa bus (via PCI connector 306) to a riser board PCI bus (via connector 308). Riser board 304 provides one or more PCI connectors 310 oriented so that PCI add-in cards will lie substantially parallel to the surface of motherboard 300 and orientated so that they avoid interfering with I/O circuitry and an installed processor. Motherboard 300 may also include standard ATX features such as ISA connectors 312, multiple PCI connectors 314, system memory sockets 316, and processor socket or receptacle 318.

If riser board 304 provides only one or two add-in slots 310, the resulting ATX-based system may be characterized as a low profile ATX system. Alternatively, a large expansion capability may be provided by equipping riser board 304 with a larger number of add-in card slots. In this latter case, riser board 304 may be physically supported by one or more additional connections to the computer system's chassis.

Figure 4:
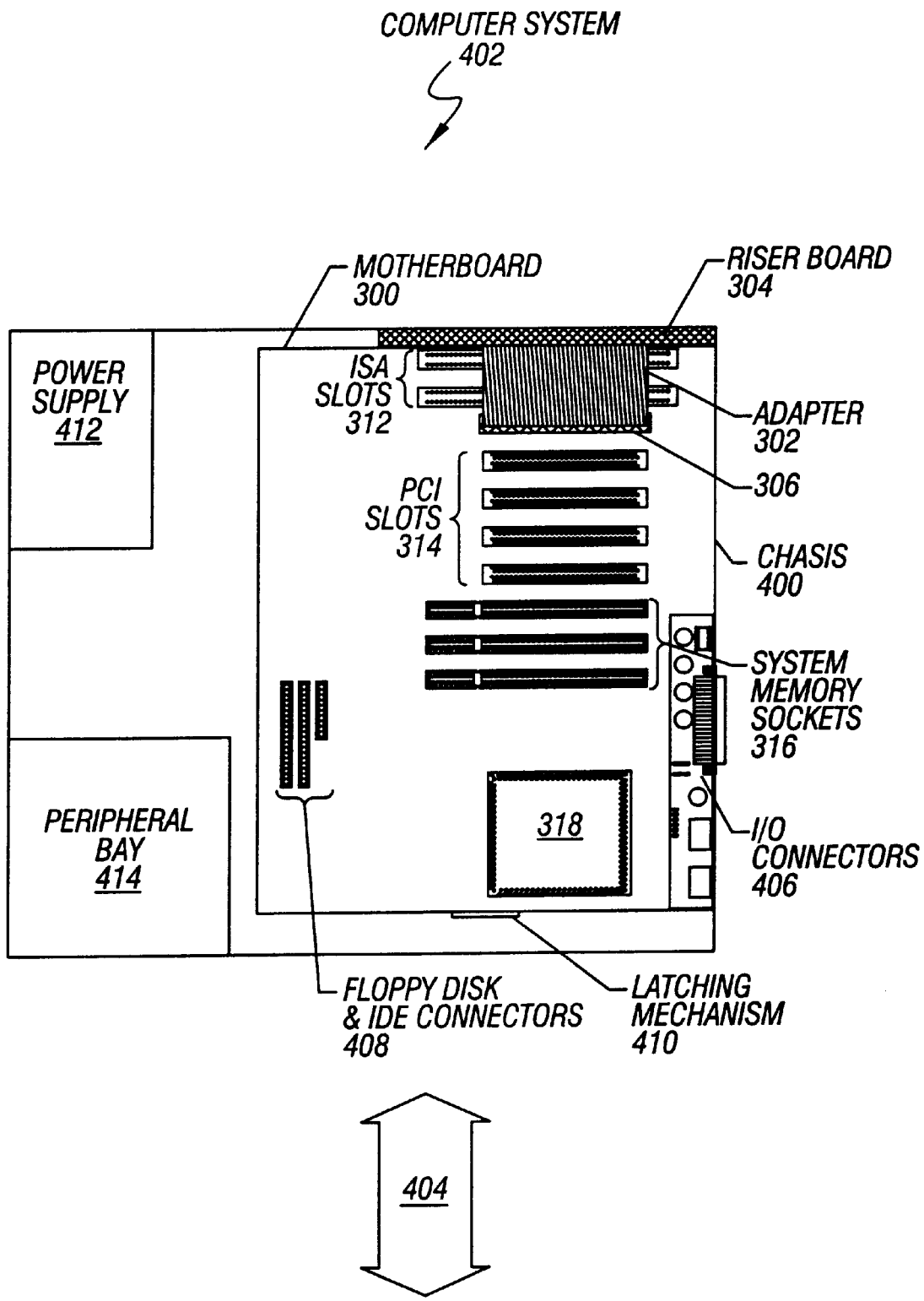
FIG. 4. shows a to view of a personal computer system incorporating the ATX motherboard adapter, and riser board of FIG. 3.

Referring to FIG. 4, ATX motherboard 300, adapter 302, and riser board 304 may be oriented in chassis 400 to provide computer system 402 in accordance with one embodiment of the invention. As shown, adapter 302 may be fixed to PCI slot 306 on motherboard 300. When motherboard 300 is slid fully into chassis 400 (along direction indicated by arrow 404), adapter 302 mates with a complementary connector on riser board 304. Additional PCI connectors on riser board 304 may accept PCI add-in cards in a normal fashion. In one embodiment, riser board 304 provides only one or two PCI connectors-making computer system 402 a low-profile computer system. As shown, motherboard 300 may also include ISA connectors 312, multiple PCI connectors 314, system memory slots 316, I/O connectors 406, processor receptacle 318, floppy disk and IDE connectors 408, and latching mechanism 410 to secure motherboard 300 in chassis 400. Computer system 402 may also include power supply unit 412, and one or more peripheral bays 414.

Figure 5:
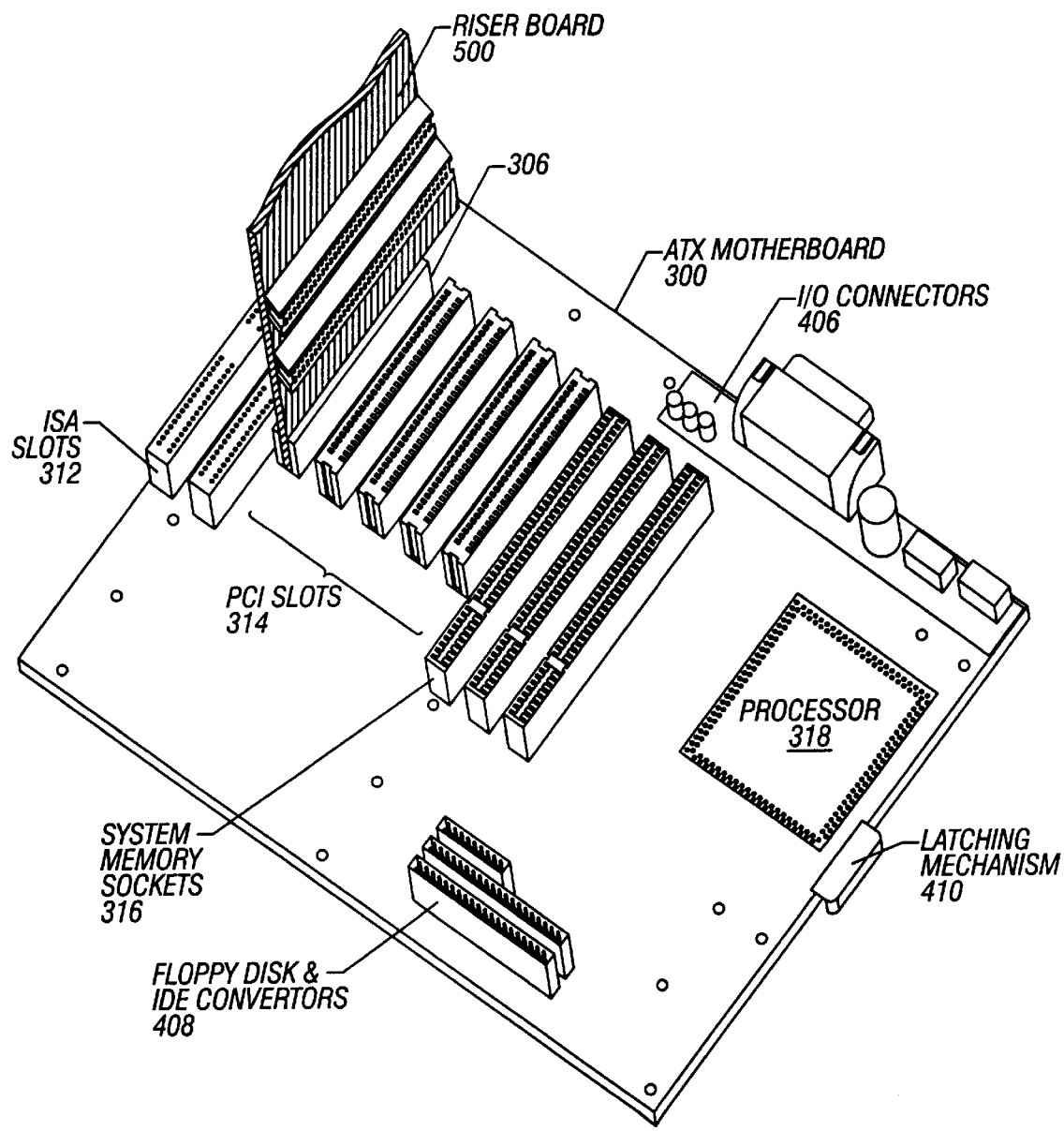
FIG. 5. shows an isometric view of a motherboard and riser board in accordance with another embodiment of the invention.

Referring to FIG. 5, in another embodiment riser board 500 may be connected directly to motherboard 300 through, for example, a card edge connector adapted to insert into one of the motherboard's PCI connectors (e.g., PCI slot 306). One advantage of the configuration of FIG. 5 is that all add-in cards may be quickly and easily removed without perturbing motherboard 300. On the other hand, the configuration of FIG. 4 allows motherboard 300 to be quickly and easily removed from chassis 400 without removing any add-in cards.

One benefit of the invention is that low profile ATX-based computer systems may be constructed by using riser boards having only one or two add-in card slots. Another benefit of the invention (as illustrated in FIGS. 3 and 4), is that motherboard 300 may be easily and quickly removed from chassis 400 without having to first remove PCI add-in cards. Yet another benefit of the invention (as illustrated in FIG. 5), is that all add-in cards may be easily and quickly removed without having to manipulate motherboard 300. These benefits may lead to a reduction in system fabrication/assembly time, as well as reduced assembly and disassembly time during maintenance operations.

In the embodiments of FIGS. 3, 4, and 5, motherboard 300 may be coupled to a chassis through a rail system. One illustrative rail system is that used in a NLX-based computer system. (See sections A.5 and A.6 of the NLX specification, version 1.2, 1997.)

Figure 6A:
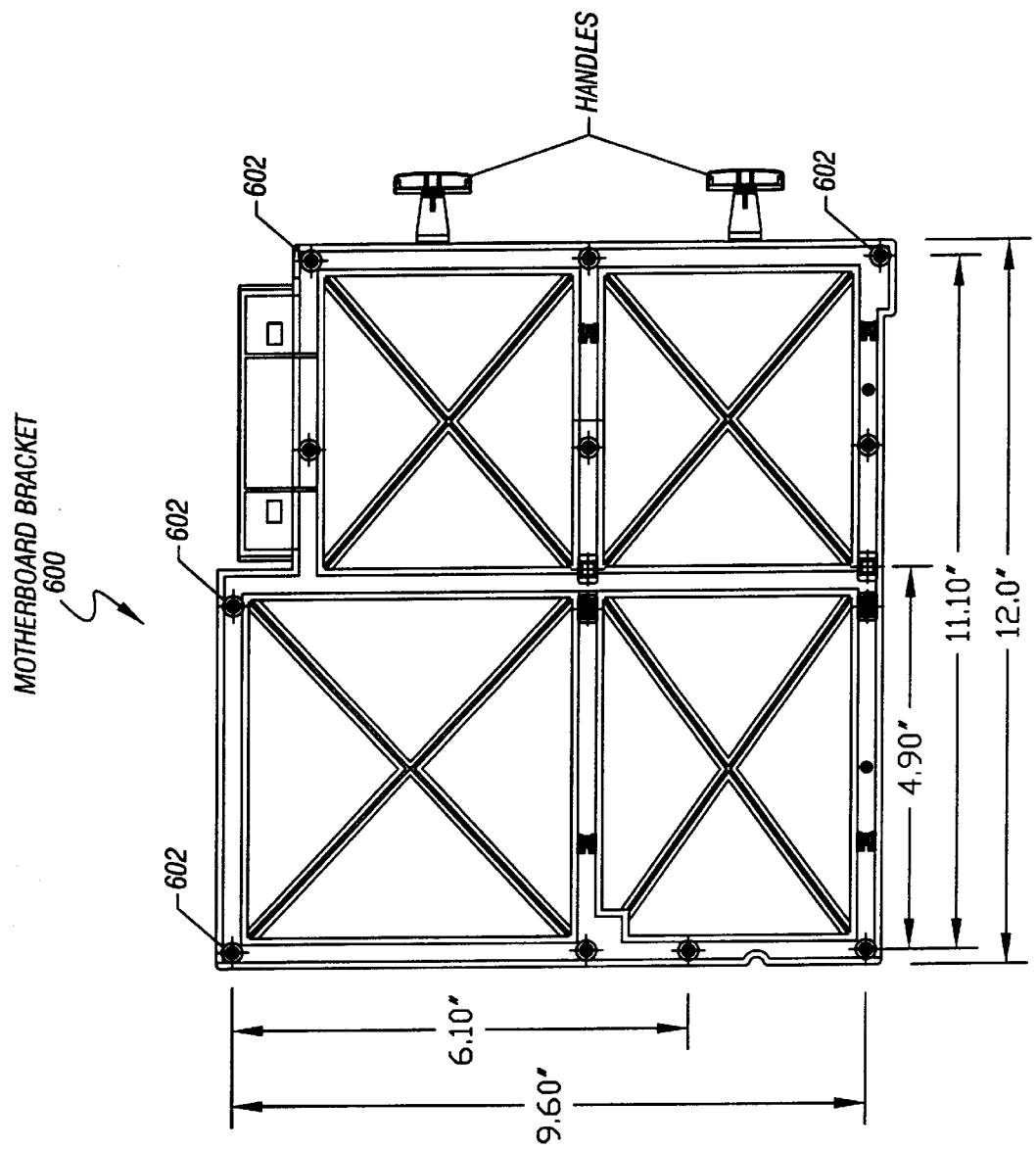
FIGS. 6A an 6B show a modular motherboard bracket in accordance with one embodiment of the invention.
Figure 6B:
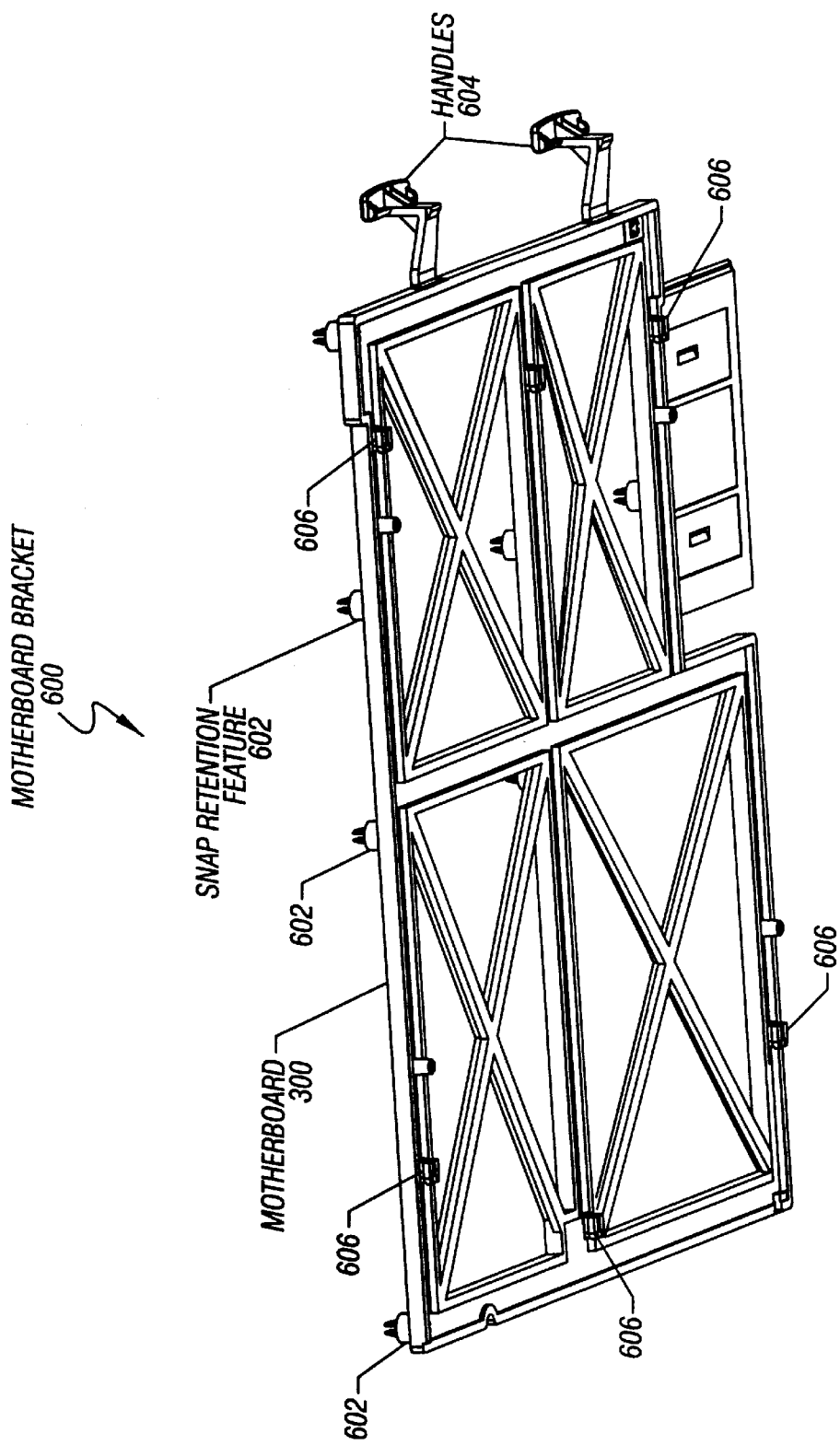

An alternative motherboard mounting system is shown in FIGS. 6A and 6B. Motherboard bracket 600 may connect to an ATX motherboard through standard ATX mounting holes. At each location on bracket 600 corresponding to an ATX mounting hole, a snap retention element 602 is provided that, when pressed through a motherboard mounting hole, expands to capture the motherboard securely to bracket 600. In an alternative embodiment, an ATX motherboard may be connected to bracket 600 through more permanent fasteners such as screws.

A motherboard may be installed onto bracket 600 by placing the bracket on a flat surface with the snap retention features facing up (see FIG. 6B). The motherboard may then be placed on top of the bracket, adjusted so that the motherboard's mounting holes are aligned with the snap retention features, and pressed on by hand or with mechanical assistance. The motherboard-bracket assembly may then be placed into a chassis by aligning guides 606 with a rail in the chassis. Once inserted, the bracket-motherboard assembly may be secured within a chassis through a locking tab or handle. One illustrative locking tab is described in the NLX specification. (See section A.5 of the NLX specification, version 1.2, 1997.) In addition, handles 604 may be used to facilitate the insertion and removal of the bracket-motherboard assembly. In one embodiment, bracket 600 may be constructed from Acrylonitrile Butadiene-Styrene (ABS) plastic. In another embodiment, bracket 600 may be constructed from nylon.

One benefit of a bracket in accordance with FIGS. 6A and 6B, is that it may reduce the number of parts needed by a technician during system assembly by eliminating the use of screws to mount the motherboard into a chassis. Another benefit of the inventive bracket is that damage to a motherboard from driver bits slipping out of a technician's screw socket may be reduced by eliminating the use of screws to attach the motherboard to the chassis. Yet another benefit of the bracket-motherboard assembly is that the bracket provides additional structural stiffness to the motherboard, which may reduce motherboard damage due to flexing induced during normal handling and assembly processes.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A computer system comprising:
   a chassis;
   a motherboard having a top surface and a bottom surface with at least one PCI connector connected to the top surface;
   a riser board connected to the chassis and having a first connector and at least one PCI connector on a first surface, the first surface oriented substantially perpendicular to the motherboard; and
   an adapter separate from the motherboard and the riser board coupling the at least one PCI connector of the motherboard and the first connector of the riser board.

2. The computer system of claim 1, further comprising a bracket connected to the bottom surface of the motherboard.

3. The computer system of claim 2, wherein the bracket is connected to the motherboard by a plurality of snap fasteners.

4. The computer system of claim 2, wherein the bracket is connected to the motherboard by a plurality of screws.

5. The computer system of claim 2, wherein the bracket is adapted to connect to an ATX motherboard.

6. The computer system of claim 5, wherein the ATX motherboard comprises a mini-ATX motherboard.

7. The computer system of claim 2, wherein the bracket further comprises guides and the chassis further comprises rails, the guides adapted to slideably engage the rails.

8. The computer system of claim 7, further comprising a locking means to secure the bracket and motherboard into the chassis.

9. The computer system of claim 1, further comprising at least one PCI add-in card connected to the at least one PCI connector of the riser board.

10. A computer system comprising:
    a chassis;
    a motherboard coupled to the chassis and having a top surface and a bottom surface with at least one PCI connector connected to the top surface;
    a bracket connected to the bottom surface of the motherboard and further connected to the chassis; and
    a riser board connected to the at least one PCI connector of the motherboard and having at least one PCI connector on a first surface, the first surface oriented substantially perpendicular to the motherboard.

11. The computer system of claim 10, wherein the riser board is connected to the at least one PCI connector of the motherboard by a card edge connector.

12. The computer system of claim 10, wherein the bracket is connected to the motherboard by a plurality of snap fasteners.

13. The computer system of claim 10, wherein the bracket is connected to the motherboard by a plurality of screws.

14. The computer system of claim 10, wherein the bracket is adapted to connect to an ATX motherboard.

15. The computer system of claim 14, wherein the ATX motherboard comprises a mini-ATX motherboard.

16. The computer system of claim 10, wherein the bracket further comprises guides and the chassis further comprises rails, the guides adapted to slideably engage the rails.

17. The computer system of claim 16, further comprising a locking means to secure the bracket and motherboard into the chassis.

18. The computer system of claim 10, further comprising at least one PCI add-in card connected to the at least one PCI connector of the riser board.

* * * * *